(12) United States Patent
Kelkar et al.

(10) Patent No.: US 8,124,916 B2
(45) Date of Patent: Feb. 28, 2012

(54) THERMAL PROCESSING OF SILICON WAFERS

(75) Inventors: Amit S. Kelkar, Flower Mound, TX (US); Larry Puechner, Dallas, TX (US); David E. Billings, Lewisville, TX (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 1352 days.

(21) Appl. No.: 11/735,639

(22) Filed: Apr. 16, 2007

(65) Prior Publication Data
US 2008/0254599 A1 Oct. 16, 2008

(51) Int. Cl.
*F27B 5/04* (2006.01)
*F27B 5/16* (2006.01)
*H01L 21/324* (2006.01)

(52) U.S. Cl. .......................... 219/390; 438/797; 432/152

(58) Field of Classification Search .................. None
See application file for complete search history.

(56) References Cited

U.S. PATENT DOCUMENTS

| | | | | |
|---|---|---|---|---|
| 6,004,868 A * | 12/1999 | Rolfson et al. | ............... | 438/471 |
| 6,143,629 A * | 11/2000 | Sato | ............... | 438/455 |
| 6,335,269 B1 * | 1/2002 | Sato | ............... | 438/509 |
| 6,342,435 B1 * | 1/2002 | Rolfson et al. | ............... | 438/471 |
| 6,462,310 B1 * | 10/2002 | Ratliff et al. | ............... | 219/390 |
| 6,593,211 B2 * | 7/2003 | Sato | ............... | 438/455 |
| 6,844,528 B2 * | 1/2005 | Ratliff et al. | ............... | 219/390 |
| 6,900,413 B2 * | 5/2005 | Ratliff et al. | ............... | 219/390 |
| 7,799,598 B2 * | 9/2010 | Kuhr et al. | ............... | 438/99 |
| 2001/0041462 A1 * | 11/2001 | Kashiwagi et al. | ............... | 438/787 |
| 2003/0089698 A1 * | 5/2003 | Ratliff et al. | ............... | 219/390 |
| 2004/0161949 A1 * | 8/2004 | Yadav et al. | ............... | 438/800 |
| 2005/0053535 A1 * | 3/2005 | Beauchaine et al. | ............... | 423/219 |
| 2007/0187386 A1 * | 8/2007 | Kim et al. | ............... | 219/385 |

* cited by examiner

*Primary Examiner* — Joseph M Pelham
(74) *Attorney, Agent, or Firm* — North Weber & Baugh LLP (57) ABSTRACT

Apparatus and methods that minimize surface defect development in silicon wafers during thermal processing at relatively high temperatures at which silicon wafers are annealed and at less extreme temperature, or for other purposes. The apparatus and methods have utility to horizontally-disposed furnaces for silicon wafers and to vertically-oriented furnaces in which larger wafers can be thermally processed. A selectively-sealable process tube encloses silicon wafers during heating of the silicon wafers to a predetermined temperature, and a heating atmosphere supply system induces through the process tube a positive flow of a process gas, such as hydrogen or argon, that is non-reactive with solid silicon at the predetermined temperature. A process tube outlet vents gas from the process tube, and an impurity sensor in the process tube outlet detects oxygen and moisture in the vented gas to verify the purity of the atmosphere surrounding the wafers during thermal processing.

14 Claims, 5 Drawing Sheets

THERMAL PROCESSING OF SILICON WAFERS

BACKGROUND

A. Technical Field

The present invention relates generally to the thermal processing of silicon wafers. More particularly, the present invention pertains to the high temperature annealing of silicon wafers.

B. Background of the Invention

The annealing of silicon wafers is conducted at relatively high temperatures. To minimize the development of surface defects during such thermal processing, silicon wafers are surrounded during annealing by a process atmosphere that does not react with solid silicon.

Nonetheless, the presence of even a minute quantity of an impurity in the process atmosphere that surrounds a silicon wafer during annealing can cause pitting to occur in the surface of the silicon wafer. The presence of pits in the surface of a silicon wafer will reduce the reliability of semiconductor devices manufactured from that wafer. Defects in the surface of a silicon wafer can, for example, dramatically degrade the integrity of any gate oxide subsequently formed over that surface defect.

SUMMARY OF THE INVENTION

Accordingly, the present invention provides apparatus and methods that minimize the development of surface defects in a silicon wafer during thermal processing, particularly during thermal processing at the relatively high temperatures at which silicon wafers are annealed. Such relatively high temperatures range above and below a typical annealing temperature of about 1200 degrees Centigrade. Nonetheless, the principles and concepts residing among the teachings of the present invention will in addition have applicability to the thermal processing of silicon wafers in controlled conditions at less extreme temperature, and for purposes other than for annealing.

The present invention has utility relative, both to horizontally-disposed furnaces for silicon wafers, as well as to vertically-oriented furnaces in which wafers of six or more inches in diameter are thermally processed.

Certain features and advantages of the invention have been generally described in this summary section; however, additional features, advantages, and embodiments are presented herein or will be apparent in view of the drawings, specification, and claims hereof. Accordingly, it should be understood that the scope of the invention is not to be limited by the particular characterizations presented in this summary section.

BRIEF DESCRIPTION OF THE DRAWINGS

Reference will be made to embodiments of the present invention, examples of which are shown in the accompanying figures. Those figures are intended to be illustrative, however, rather than limiting. Although the present invention is generally described in the context of the embodiments shown in the accompanying figures, the scope of the present invention is not to be restricted to the details of those particular embodiments.

DETAILED DESCRIPTION OF THE PREFERRED EMBODIMENTS

In the following description, for the purpose of explanation, specific details are set forth in order, by the use of concrete examples, to provide a sound understanding of the present invention. It will be apparent, however, that the present invention may be practiced without some or even all of those details, and it will be recognized that embodiments of the present invention, some of which are described below, may be incorporated into a number of different device, systems, and methods. Structures, device, and methods depicted in block diagram are merely illustrative of exemplary embodiments of the present invention and are included in that form in order to avoid obscuring essential teachings of the present invention.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

Reference in the specification to "one embodiment" or "an embodiment" indicate that a particular feature, structure, characteristic, function, or method step described in connection with that embodiment is included in at least one embodiment of the present invention. The various uses of the phrase "in one embodiment" at different locations throughout the specification do not necessarily constitute multiple references to a single embodiment of the present invention.

A. Apparatus for Thermally Processing Silicon Wafers

Figure 1:
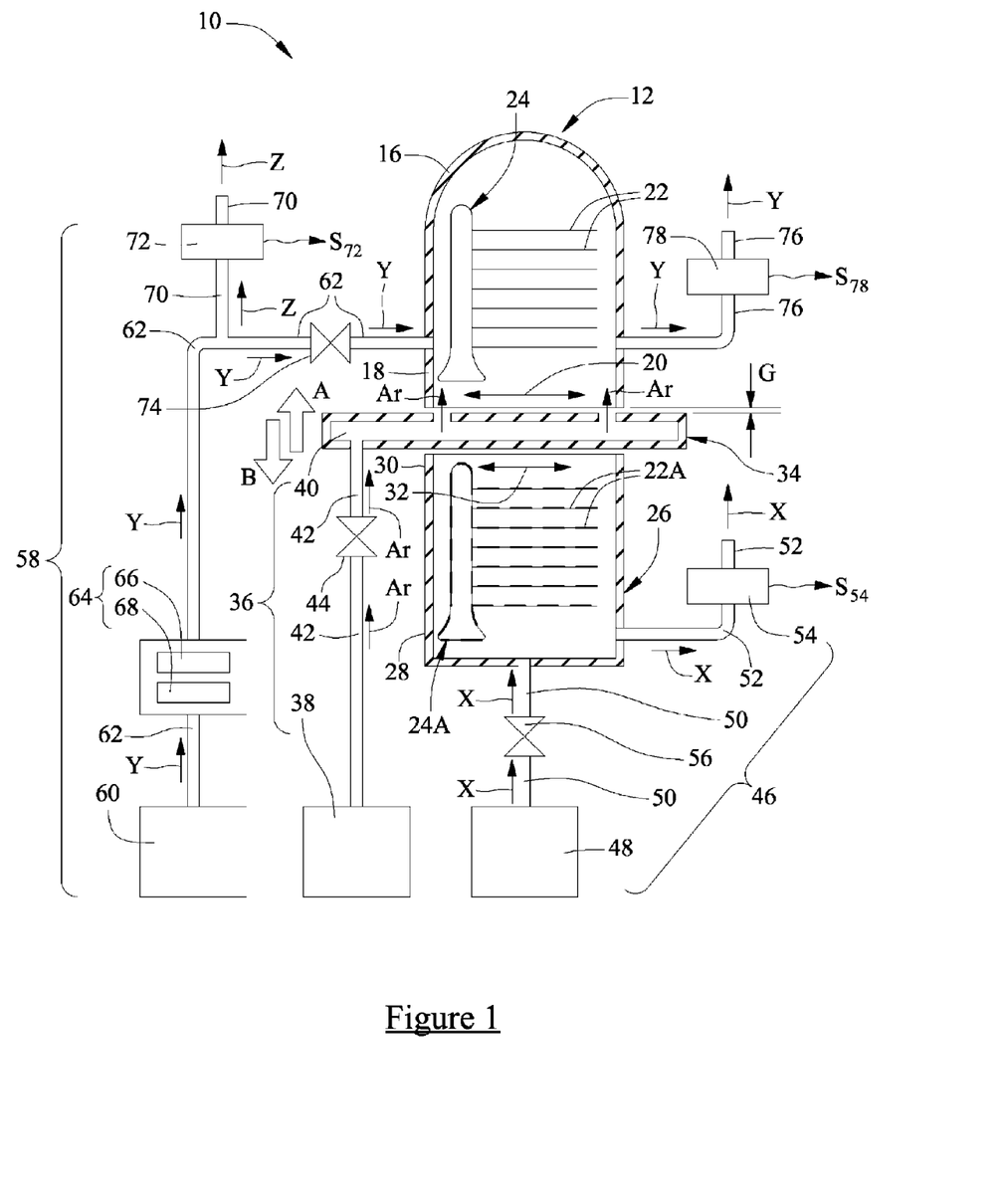
FIG. 1 is a diagram of an embodiment of an apparatus for thermally processing silicon wafers that incorporates teachings of the present invention.

FIG. 1 depicts elements of one embodiment of an apparatus 10 that incorporates teachings of the present invention. Apparatus 10 is, thereby, capable of undertaking the thermal processing of a silicon wafer and minimizing the development of defects in the surface of the wafer during that processing. Apparatus 10 is so sized as to be able to function in this manner relative to one or to a plurality of silicon wafers. For convenience and consistency in the accompanying figures and in the detailed discussion that follows, a plurality of silicon wafers will be depicted and addressed. Doing so is not intended, however, to preclude the use of apparatus 10 to thermally process solely a single silicon wafer.

Central to apparatus 10 is a selectively-sealable process tube 12 that defines therewithin a heat treatment area for silicon wafers. Process tube 12 is so configured as to be able to receive silicon wafers into that heat treatment area, and after being sealed, enclose the silicon wafers during warming of process tube 12 and the wafers therein to a predetermined temperature T. When silicon wafers are to be annealed in process tube 12, predetermined temperature T will be in a range of from about 1175 degrees Centigrade to about 1250 degrees Centigrade. More typically, annealing is conducted at a predetermined temperature T of about 1200 degrees Centigrade. Nonetheless, apparatus and systems that thermally process silicon wafers at other temperatures, or toward other objectives, will also benefit from teaching of the present invention, and particularly form the inclusion of all or some of the exemplary elements and subsystems included in apparatus 10 shown in FIG. 1.

Process tube 12 is an elongated tubular structure, possibly but not necessarily of cylindrical construction, that has a closed end 16 and an open end 18 that includes an opening 20 into the heating area within process tube 12. As depicted, by way of example and not by way of limitation, the longitudinal axis of process tube 12 is oriented vertically, whereby closed end 16 of process tube 12 is positioned at the top of process tube 12, and open end 18 of process tube 12 is positioned at the bottom of process tube 12. Such an orientation in a process tube is the hallmark of a vertically-oriented furnace for silicon wafers. Accordingly, it is likely, but not necessary, that process tube 12 is possessed of a relatively large inner diameter of ten or more inches by which to encompass for thermal processing silicon wafers of six or more inches in diameter. The inner diameter of process tube 12 may, however, be of a smaller dimension. Whether or not that is the case, the longitudinal axis of process tube 12 may be oriented horizontally, in which case the apparatus incorporating process tube 12 would be a horizontally-oriented furnace for silicon wafers. Typically, process tube 12 is comprised of a material, such as quartz, that is structurally stable at high temperatures.

By way of illustration, process tube 12 of apparatus 10 is shown enclosing a plurality of silicon wafers 22 that are to be heated to predetermined temperature T and maintained at that temperature for a corresponding treatment period. Typically, silicon wafers that are to be subjected to thermal processing, such as to annealing, are supported from a structure that is sufficiently mobile among the elements of a thermal processing device, such as apparatus 10, as to be able to move into and out of process tube 12, ferrying the wafers to and from the thermal processing step that is to be conducted therein. Accordingly, such a mobile support structure for silicon wafers is referred to in the relevant industry as "a boat", and for convenience of illustration a nonrepresentational version of a silicon wafer transport boat 24 is shown positioned in process tube 12 supporting seven silicon wafers 22. Transport boat 24 could as well support merely a single silicon wafer 22.

The placement of silicon wafers 14 onto transport boat 24 and the removal of silicon wafers from transport boat 24 occur, not in process tube 12, but rather in another portion of apparatus 10, a load lock 26 that is positioned at open end 18 of process tube 12. The interior of load lock 26 functions as a staging area in which silicon wafers are assembled onto and unloaded from a transport boat. Lock 26 has a closed end 28 and an open end 30. As the arrangement of components shown by way of example in FIG. 1 is an exemplary vertically-oriented furnace, load lock 26 is positioned below process tube 12, closed end 28 of load lock 26 is at the top of load lock 26, and open end 30 of load lock 26 is at the bottom. Open end 30 of load lock 26 includes an opening 32 into the staging area within load lock 26, and open end 30 of load lock 26 is located directly opposite, or below, opening 20 into process tube 12. In some thermal processing devices, a load lock, such as load lock 26 in apparatus 10, is provided with a degree of mobility that permits the load lock to travel at least toward and away from an associated process tube, such as process tube 12.

For illustrative purposes, load lock 26 is shown to enclose the same transport boat and the same seven silicon wafers as are disposed in process tube 12. In the interest of for clarity, however, when positioned in load lock 26 those structures will be depicted in dashed lines and identified, respectively, as a transport boat 24A and as silicon wafers 22A.

Interposed between opening 20 of process tube 12 and opening 32 of load lock 26 is a planar closure cap 34. Closure cap 34 is capable selectively of closing opening 20 at open end 18 of process tube 12. Closure cap 34 is advanced in a direction suggested by arrow A toward process tube 12. This closes the gap G between process tube 12 and cap 34, eventually allowing closure cap 34 to sealingly engage the sides of open end 20 of process tube 12 at the periphery of opening 20. Process tube 12 is sealed in this manner only after transport boat 24 has entered process tube 12 carrying silicon wafers 22, but before the commencement of the step of heating silicon wafers 22 in process tube 12. Following the step of heating silicon wafers 22 in process tube 12, closure cap 34 is moved away from process tube 12 in a direction suggested by arrow B to unseal opening 20 into process tube 12. Transport boat 24 and silicon wafers 22 are then extracted from process tube 12, and silicon wafers 22A are unloaded from transport boat 24A in load lock 26.

To sustain the purity of the atmosphere surrounding transport boat 24 and silicon wafers 22 in process tube 12 once silicon wafers 22 are eventually subjected to thermal processing, apparatus 10 includes a cap purge system 36. The elements of cap purge system 36 are so constituted and configured as to deliver argon gas Ar across gap G, when closure cap 36 is being advanced into sealing engagement with opening 20. Accordingly, cap purge system 36 includes a pressurized argon gas source 38, a network of argon gas purge channels 40 formed within cap 34, and an argon gas delivery line 42 that communicates argon gas under positive pressure from argon gas source 38 to argon gas purge channels 40 in closure cap 34. Argon gas purge channels 40 are so configured as to expel argon gas Ar from closure cap 34 toward process tube 12 immediately inside the entire periphery of opening 20 thereinto.

Argon is a gas that is non-reactive with solid silicon at all temperatures relevant to the thermal processing of silicon wafers, and particularly at any predetermined temperature T at which annealing can be effected. Cap purge system 36 insures that any gas joining the atmosphere in the heating area inside process tube 12 during the closure of gap G by the movement of cap 34 toward opening 20 is a gas that, like argon, is inert to solid silicon at predetermined temperature T.

To preclude any compromise of the purity of argon gas Ar supplied by cap purge system 36 into process tube 12, the flow of argon gas Ar through argon gas delivery line 42 is controlled by a pneumatic control valve 44 that is argon-activated. In this manner, should routine measures be unsuccessful in segregating pneumatic control gases from the valved gas, any leakage of pneumatic control gas into argon gas Ar of cap purge system 36 will be simply more argon, a gas that is non-reactive with solid silicon at predetermined temperature T.

In another aspect of the present invention, apparatus 10 includes a load lock purge system 46 that communicates with load lock 26 and induces therethrough a positive flow of a staging gas X chosen from a group of gasses comprising hydrogen ($H_2$) and argon (Ar). Load lock purge system 46 is operated during the time that silicon wafers 22A are being assembled onto transport boat 24A in load lock 26 preparation to be moved into process tube 12. Both hydrogen and argon are non-reactive with solid silicon at any predetermined temperature T. Consequently, replacing the atmosphere surrounding silicon wafers 22A and transport boat 24A during assembly in load lock 26 insures that gases that might react with the wafers during thermal processing do not linger about or attach to those structures once silicon wafers 22A and transport boat 24A are eventually moved into process tube 12 for thermal processing.

Load lock purge system 46 includes a pressurized staging gas source 48, a staging gas delivery line 50 that communicates staging gas X to load lock 26, and a load lock outlet line 52 that vents gas from load lock 26 during operation of load lock purge system 46. A load lock impurity sensor 54 is located in load lock outlet line 52 to monitor the quality of gas being vented from load lock 26 during operation of load lock purge system 46. In particular, load lock impurity sensor 54 is intended to monitor the gas vented from load lock 26 for moisture ($H_2O$) and oxygen ($O_2$). Load lock impurity sensor 54 generates an electrical or other signal $S_{54}$ reflective of the content of the gas vented from load lock 26. When signal $S_{54}$ reflects that the concentration of moisture and the concentration of oxygen in the gas being vented from load lock 26 are below respective predetermined allowable levels, system 10 proceeds to move silicon wafers 22A and transport boat 24A out of load lock 26 and into process tube 12. The variety of signal $S_{54}$ reflecting that the concentration of moisture and the concentration of oxygen in the gas being vented from load lock 26 are below respective predetermined allowable levels thus functions as a go-condition signal for further processing of silicon wafers 22A, while a contrary form of signal $S_{54}$ functions as a stop-condition signal for system 10.

To preclude any compromise of the purity of staging gas X supplied by cap purge system 46 into load lock 26, the flow of staging gas X through staging gas delivery line 50 is controlled by a pneumatic control valve 56 that is argon-activated. In this manner, should routine measures be unsuccessful in segregating pneumatic control gases from the valved gas, any leakage of pneumatic control gas into staging gas X of load lock purge system 46 will be simply argon, a gas that is non-reactive with solid silicon at predetermined temperature T.

In another aspect of the present invention, apparatus 10 includes a heating atmosphere supply system 58 that communicates with load lock 12 and induces therethrough a positive flow of a process gas Y that is non-reactive with solid silicon at predetermined temperature T. Process gas Y is chosen from a group of gasses comprising hydrogen ($H_2$) and argon (Ar). Heating atmosphere supply system 58 is operated during the time that silicon wafers 22 are being heated in process tube 12 to predetermined temperature T. Both hydrogen and argon are non-reactive with solid silicon at any predetermined temperature T. Consequently, replacing the atmosphere surrounding silicon wafers 22 during thermal processing insures that gases that might react with the wafers then are not present to do so.

Heating atmosphere supply system 58 includes a pressurized process gas source 60, a process gas supply line 62 that communicates process gas Y to process tube 12, and a point-of-use purifier 64 interposed in process gas supply line 62 to the flow of process gas Y therethrough. Point-of-use purifier 64 includes a filter 66 of particulate media in process gas Y and an absorbent 68 of metallic contaminants in process gas Y. Particulate media and metallic contaminants in the atmosphere surrounding silicon wafers 22 during thermal processing would contribute to the development defects in silicon wafers 22. As a result, regardless of the purity of process gas Y in pressurized process gas source 60, immediately prior to actual use in process tube 12 process gas Y is relieved by point-of-use purifier 64 of any latent or acquired contaminants that could give rise to surface defects in silicon wafers 22 during thermal processing.

Also contributing to the purity of process gas Y supplied to process tube 12, and thus part of heating atmosphere supply system 58, is a bypass loop 70 that communicates with process gas supply line 62 and draws therefrom a sample Z of the gas that is flowing through process gas supply line 62 toward process tube 12. Located in process gas supply line 62 is a dew point meter 72 that detects moisture ($H_2O$) in sample Z of the gas being drawn through bypass loop 70. Moisture in the atmosphere surrounding silicon wafers 22 would react therewith at predetermined temperature T giving rise to defects in silicon wafers 22 during thermal processing.

Dew point meter 72 generates an electrical or other signal $S_{72}$ that is reflective of the content of sample Z of gas drawn through bypass loop 70. When signal $S_{72}$ reflects that the concentration of moisture in sample Z of the gas being drawn through bypass loop 70 is below a predetermined allowable level, system 10 allows the thermal processing of silicon wafers 22 to commence. Thermal processing continues in process tube 12 so long as this prerequisite condition is maintained in the gas being drawn through bypass loop 70. The variety of signal $S_{72}$ reflecting that the concentration of moisture in sample Z of the gas being drawn through bypass loop 70 is below a predetermined allowable level thus functions as a go-condition signal for thermal processing of silicon wafers 22, while a contrary form of signal $S_{72}$ functions as a stop-condition signal for system 10 in that regard.

To preclude any compromise of the purity of process gas Y supplied by heating atmosphere supply system 58 to process tube 12, the flow of process gas Y through process gas supply line 62 is controlled by a pneumatic control valve 74 that is argon-activated. In this manner, should routine measures be unsuccessful in segregating pneumatic control gases from the valved gas, any leakage of pneumatic control gas into process gas Y of heating atmosphere supply system 58 will be simply argon, a gas that is non-reactive with solid silicon at predetermined temperature T.

Functioning in harmony with heating atmosphere supply system 58, apparatus 10 is provided with a process tube outlet line 76 that vents gas from process tube 12 during operation of heating atmosphere supply system 58. A process tube impurity sensor 78 is located in process tube outlet line 76 to monitor the quality of gas being vented from process tube outlet line 76 during operation of heating atmosphere supply system 58. In particular, process tube impurity sensor 78 is intended to monitor the gas vented from process tube 12 for the presence therein of moisture ($H_2O$) and oxygen ($O_2$). Process tube impurity sensor 78 generates an electrical or other signal $S_{78}$ that is reflective of the content of the gas vented from process tube 12. When signal $S_{78}$ reflects that the concentration of moisture and the concentration of oxygen in the gas being vented from process tube 12 are each below respective predetermined allowable levels, system 10 proceeds to thermally process silicon wafers 22 in process tube 12. Thermal processing continues in process tube 12 so long as this prerequisite condition is maintained in the gas being vented from process tube 12. The variety of signal $S_{78}$ reflecting that the concentration of moisture and the concentration of oxygen in the gas being vented from process tube 12 are each below respective predetermined allowable levels, thus functions as a go-condition signal for further processing of silicon wafers 22, while a contrary form of signal $S_{78}$ functions as a stop-condition signal for system 10.

B. Method for Thermally Processing Silicon Wafers

The present invention also contemplates a method for thermally processing silicon wafers in order to minimize the formation of defects in the surface of those wafers during the processing.

Figure 2:
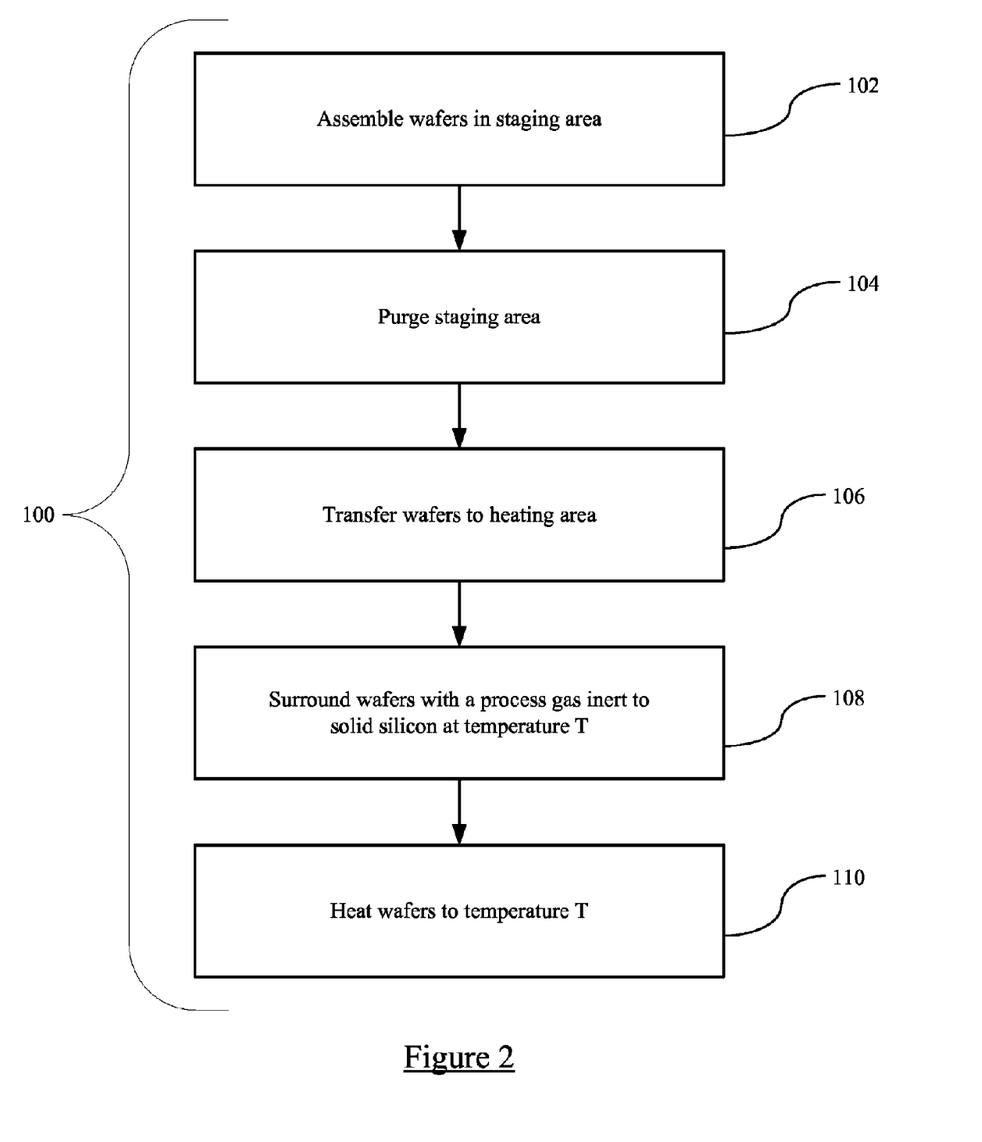
FIG. 2 is a flow chart of an embodiment of a method for thermally processing silicon wafers that incorporates teachings of the present invention.

FIG. 2 is a flow chart that provides an overview of an embodiment of a method 100 incorporating teachings of the present invention for thermally processing silicon wafers. Method 100 includes the step identified in process box 102 of assembling in a staging area a silicon wafer that is to be thermally processed and the step identified in process box 104 of purging the atmosphere in the staging area with a staging gas that is non-reactive with solid silicon at a predetermined treatment temperature T. The staging gas is selected from a group of gasses comprising hydrogen ($H_2$) and argon (Ar). Method 100 also includes the step identified in process box 106 of transferring the silicon wafer from the staging area to a heat treatment area, the step identified in process box 108 of surrounding the silicon wafer in the heat treatment area with the process gas, and the step identified in process box 110 of heating the silicon wafer to predetermined temperature T in the process gas in the heat treatment area.

Figure 3:
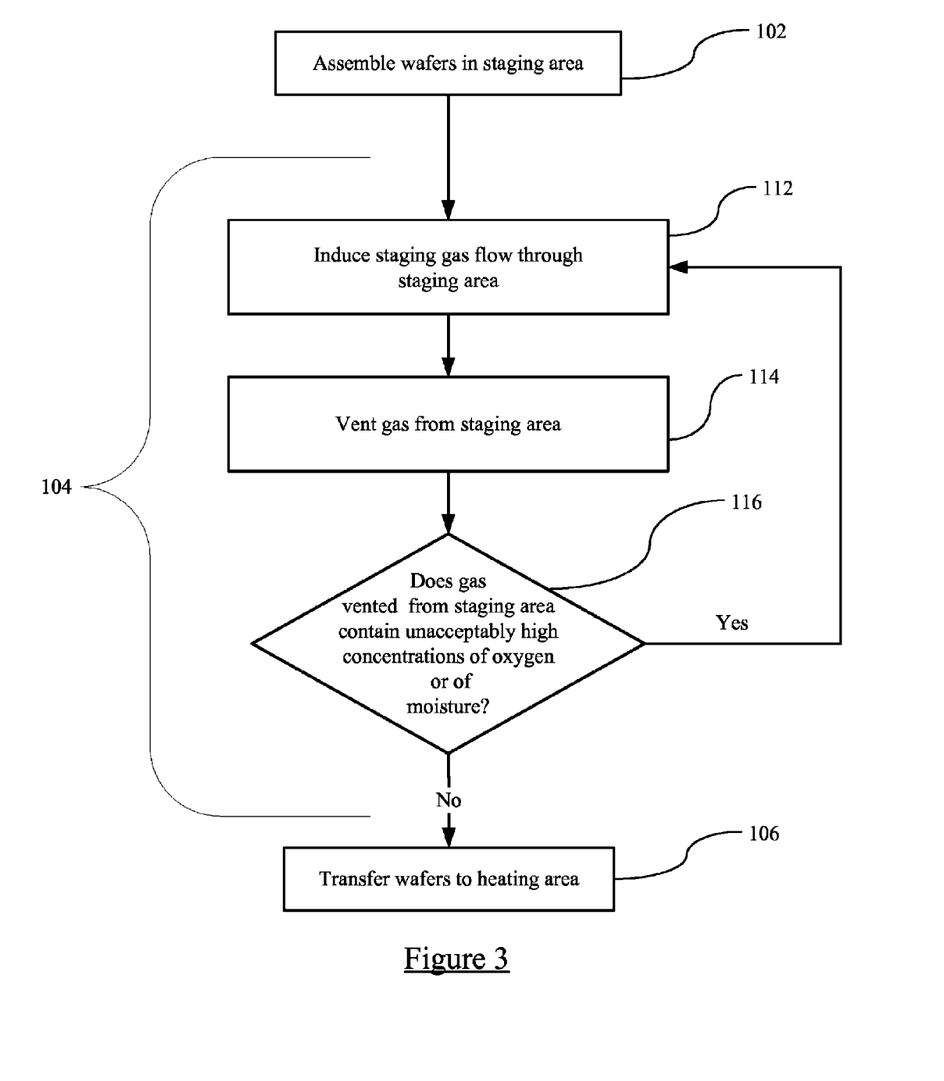
FIG. 3 is a flow chart of one embodiment of a subroutine for performing the step of purging the staging area in the method of FIG. 2.
Figure 4:
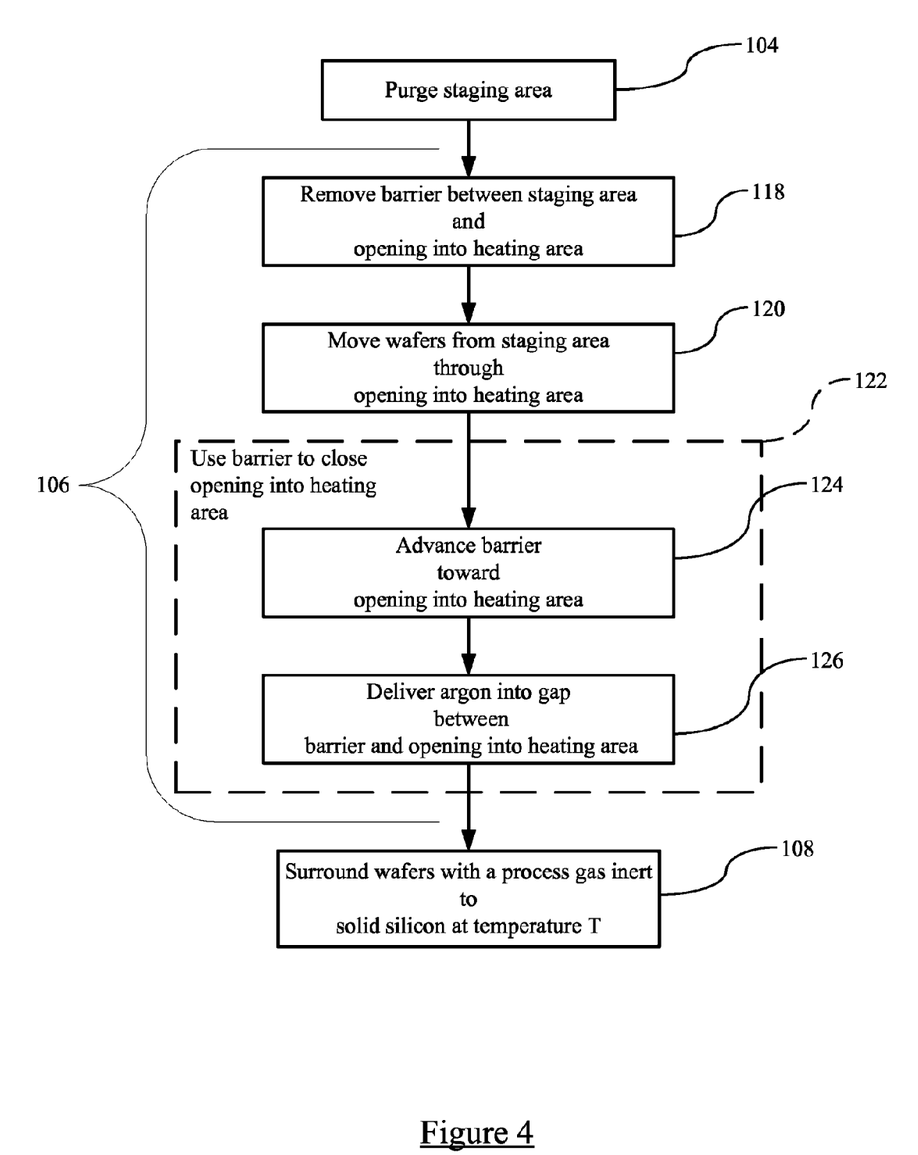
FIG. 4 is a flow chart of one embodiment of a subroutine for performing the step of transferring silicon wafers in the method of FIG. 2.
Figure 5:
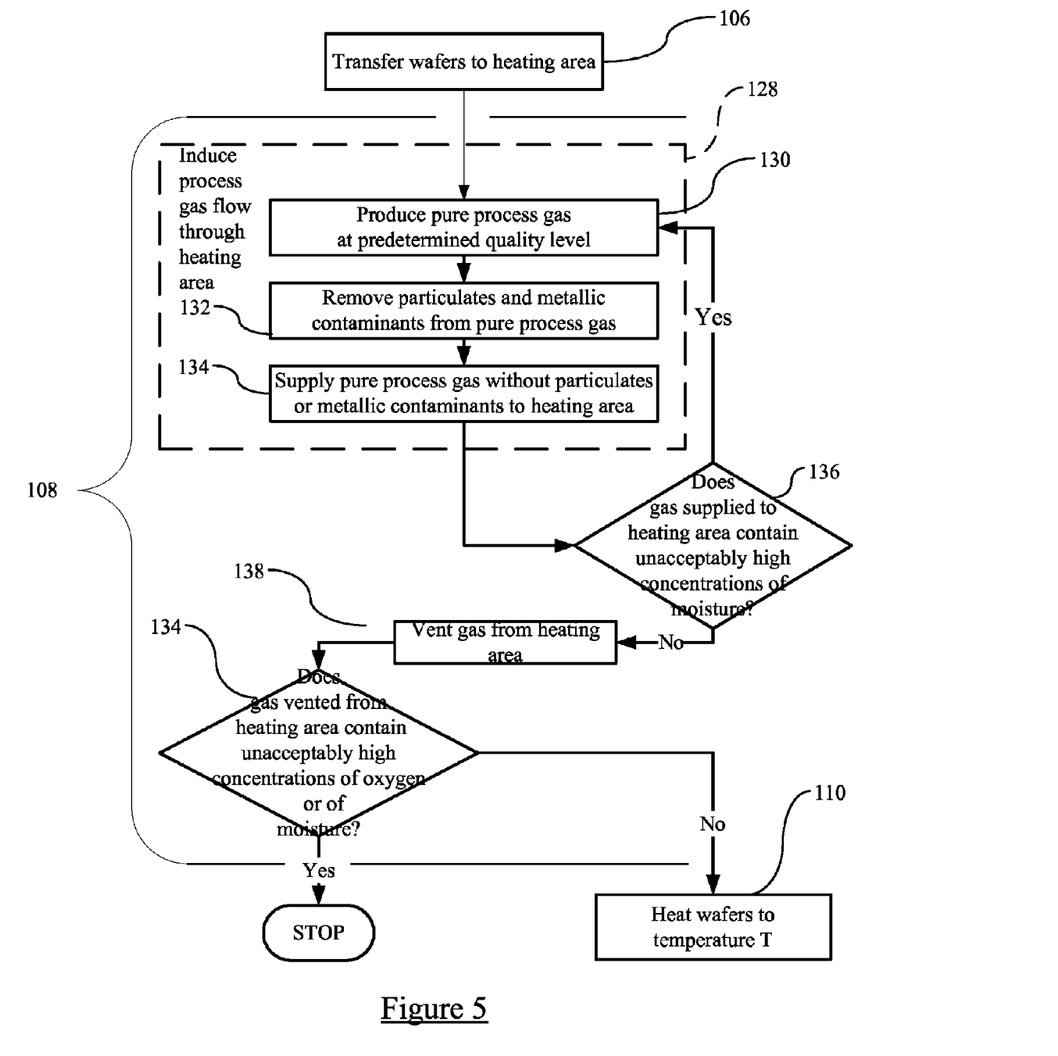
FIG. 5 is a flow chart of one embodiment of a subroutine for performing the step of surrounding silicon wafers in the method of FIG. 2.

FIGS. 3-5 are flow charts present subroutines for performing selected of the method steps shown in method 100 of FIG. 2.

FIG. 3 is a flow chart of one embodiment of a subroutine for performing the step of purging the staging area identified in process box 104 in method 100 of FIG. 2. The step of purging the staging area identified in process box 104 follows or is conducted simultaneously with the step identified in process box 102 of assembling a silicon wafer in a staging area, but both the step identified in process box 102 of assembling a silicon wafer and the illustrated subroutine for performing the step of purging the staging area identified in process box 104 precede the step identified in process box 106 of transferring the silicon wafer from the staging area to a heat treatment area.

The illustrated subroutine for performing the step of purging the staging area includes the step of inducing a positive flow of the staging gas through the staging area identified in process box 112, and the step of venting gas from the staging area during that positive flow of the staging gas identified in process box 114. Decision diamond 116 then requires an evaluation of whether the vented gas from the staging area contains unacceptably high concentrations of oxygen or of moisture. Doing so involves the steps of monitoring gas vented from the staging area to detect the presence therein of each of oxygen and of moisture, and proceeding with the step of transferring the silicon wafer identified in process box 106 only when the concentration of oxygen and the concentration of moisture detected in the gas vented from the staging area are below respective predetermined allowable levels. If a concentration of oxygen or a concentrating of moisture is detected in the gas vented from the staging area that is not below those respective predetermined allowable levels, then the subroutine for performing the step of purging the staging area is continued, until concentrations of such contaminants are below those respective predetermined allowable levels.

FIG. 4 is a flow chart of one embodiment of a subroutine for performing the step of transferring silicon wafers identified in process box 106 in method 100 of FIG. 2. The step of transferring silicon wafers identified in process box 106 follows the step identified in process box 104 of purging the atmosphere in the staging area with a staging gas, but precedes step identified in process box 108 of surrounding the silicon wafer in the heat treatment area with the process gas.

The illustrated subroutine for performing the step of transferring silicon wafers includes the step of removing a barrier interposed between the staging area and an opening into the heat treatment area identified in process box 118, the step of moving the silicon wafer from the staging area through the opening into the heat treatment area identified in process box 120, and the step identified in dashed process box 122 of using the barrier to close the opening into heat treatment area. That step of closing the opening into heat treatment area with the barrier itself includes the step of advancing the barrier into sealing engagement with the sides of the opening into the heat treatment area identified in process box 124 and the step identified in process box 126 of delivering argon gas across a gap between the barrier and the sides of the opening into the heat treatment area during the step of advancing the barrier.

FIG. 5 is a flow chart of one embodiment of a subroutine for performing the step of surrounding silicon wafers identified in process box 108 in method 10 of FIG. 2. The step of surrounding silicon wafers identified in process box 108 follows the step identified in process box 106 of transferring the silicon wafer from the staging area to a heat treatment area, but precedes and is conducted simultaneously with the step identified in process box 110 of heating the silicon wafer to predetermined temperature T.

The illustrated subroutine for performing the step of surrounding silicon wafers includes the step identified in dashed process box 128 of inducing through the heat treatment area a positive flow of the process gas, evaluating whether the vented gas from the staging area contains unacceptably high concentrations of oxygen or of moisture as called for in decision diamond 136, and proceeding, albeit through other steps in the illustrated subroutine, toward the step of heating the silicon wafer to predetermined temperature T identified in process box 110 only when the vented gas from the staging area contains concentrations of oxygen and concentrations of moisture that are below respective predetermined allowable levels. If the vented gas from the staging area does contains concentrations of hydrogen or concentrations of moisture that are not below those respective predetermined allowable levels, method 100 continues the step of inducing through the heat treatment area a positive flow of the process gas identified in dashed process box 128.

The step identified in dashed process box 128 of inducing through the heat treatment area a positive flow of the process gas includes the step of purifying the process gas to a predetermined quality level identified in process box 130, the step identified in process box 132 of removing from the pure process gas all particulate media and all metallic contaminants, and the step identified in process box 134 of supplying the pure process gas to the heat treatment area, which should occur after the step of removing media and metallic contaminants from the pure process gas.

The subroutine illustrated in FIG. 5 for performing the step of surrounding silicon wafers includes the step identified in process box 138 of venting gas from the heat treatment area during positive flow of the process gas therethrough, and as indicated in decision diamond 140 the step of monitoring gas vented from the heat treatment area to detect the presence therein of unacceptably high concentrations of each of hydrogen and of moisture. Only when the concentration of oxygen and the concentration of moisture detected in the gas vented from the heat treatment area are below respective predetermined allowable levels, does method 100 proceed with the step of heating the silicon wafer to predetermined temperature T identified in process box 110. Should concentrations of hydrogen or concentrations of moisture be detected in the gas vented from the heat treatment area that are not below those respective predetermined allowable levels, method 100 is terminated, and the source of those contaminates is investigated and eliminated.

The foregoing description of the invention has been described for purposes of clarity and understanding. It is not intended to limit the invention to the precise form disclosed.

Various modifications may be possible within the scope and equivalence of the appended claims.

What is claimed is:

1. A method for thermally processing silicon wafers, the method comprising the steps of:
    (a) assembling in a staging area a silicon wafer to be thermally processed;
    (b) purging the atmosphere in the staging area with a staging gas selected from a group of gasses comprising hydrogen and argon, a positive flow of the staging gas being induced through the staging area based on operation of an argon-activated pneumatic control valve;
    (c) transferring the silicon wafer from the staging area to a heat treatment area;
    (d) surrounding the silicon wafer in the heat treatment area with a process gas, the process gas being non-reactive with solid silicon at a predetermined temperature; and
    (e) heating the silicon wafer to the predetermined temperature in the process gas in the heat treatment area.

2. A method as recited in claim 1, wherein the predetermined temperature is in a range of from about 1175 degrees C. to about 1250 degrees C.

3. A method as recited in claim 2, wherein the predetermined temperature is about 1200 degrees C.

4. A method as recited in claim 1, wherein the step of purging the atmosphere in the staging area comprises the steps of:
    (a) inducing a positive flow of the staging gas through the staging area;
    (b) venting gas from the staging area during positive flow of the staging gas therethrough;
    (c) monitoring gas vented from the staging area to detect the presence therein of each of oxygen and of moisture; and
    (d) proceeding with the step of transferring the silicon wafer, when oxygen and moisture detected in gas vented from the staging area are each below respective predetermined allowable levels.

5. A method as recited in claim 4, wherein the step of inducing a positive flow of the staging gas comprises the step of operating an argon-activated pneumatic control valve.

6. A method as recited in claim 1, wherein the step of surrounding the silicon wafer comprises the steps of:
    (a) inducing through the heat treatment area a positive flow of a process gas selected from a group of gasses comprising hydrogen and argon;
    (b) venting gas from the heat treatment area during positive flow of the process gas therethrough;
    (c) monitoring gas vented from the heat treatment area to detect the presence therein of each of oxygen and of moisture; and
    (d) heating the silicon wafer, when oxygen and moisture detected in gas vented from the heat treatment area are each below respective predetermined allowable levels.

7. A method as recited in claim 1, wherein the step of surrounding the silicon wafer comprises the steps of:
    (a) purifying to a predetermined quality level a process gas selected from a group of gasses comprising hydrogen and argon, thereby producing a pure process gas;
    (b) removing from the pure process gas all particulate media and all metallic contaminants; and
    (c) supplying the pure process gas to the heat treatment area after the step of removing.

8. A method as recited in claim 7, wherein the pure process gas includes less than one part per million of each of oxygen, nitrogen, and water.

9. A method as recited in claim 7, wherein the step of supplying the pure process gas comprises the step of operating an argon-activated pneumatic control valve.

10. A method as recited in claim 1, wherein the step of surrounding the silicon wafer comprises the steps of:
    (a) monitoring the gas entering the heat treatment area to detect the presence of moisture therein; and
    (b) heating the silicon wafer, when moisture detected in the gas entering the heat treatment area is below a predetermined allowable level.

11. A method as recited in claim 10, wherein the step of monitoring the gas entering the heat treatment area comprises the steps of:
    (a) diverting a sample of the gas entering the heat treatment area; and
    (b) evaluating the sample of the gas with a dew point meter.

12. A method as recited in claim 1, wherein the step of transferring the silicon wafer comprises the steps of:
    (a) removing a barrier interposed between the staging area and an opening into the heat treatment area;
    (b) moving the silicon wafer from the staging area through the opening into the heat treatment area;
    (c) closing the opening into heat treatment area with the barrier.

13. A method as recited in claim 12, wherein the step of closing the opening into the heat treatment area comprises the steps of:
    (a) advancing the barrier into sealing engagement with the sides of the opening into the heat treatment area; and
    (b) delivering argon gas across a gap between the barrier and the sides of the opening into the heat treatment area during the step of advancing the barrier.

14. A method as recited in claim 13, wherein the step of delivering argon gas comprises the step of operating an argon-activated pneumatic control valve.

* * * * *